(12) United States Patent
Verleye et al.

(10) Patent No.: US 7,973,334 B2
(45) Date of Patent: Jul. 5, 2011

(54) LOCALIZED TRIGGER ESD PROTECTION DEVICE

(75) Inventors: Stefaan Verleye, Beernem (BE); Geert Wybo, Ghent (BE); Benjamin Van Camp, Antwerp (BE)

(73) Assignee: Sofics BVBA, Gistel (BE)

( * ) Notice: Subject to any disclaimer, the term of this patent is extended or adjusted under 35 U.S.C. 154(b) by 349 days.

(21) Appl. No.: 12/192,312

(22) Filed: Aug. 15, 2008

(65) Prior Publication Data
US 2009/0045436 A1    Feb. 19, 2009

Related U.S. Application Data

(60) Provisional application No. 60/956,166, filed on Aug. 16, 2007, provisional application No. 60/956,962, filed on Aug. 21, 2007, provisional application No. 60/956,972, filed on Aug. 21, 2007.

(51) Int. Cl.
*H01L 29/66* (2006.01)

(52) U.S. Cl. . 257/173; 257/328; 257/355; 257/E29.181; 361/56; 307/91

(58) Field of Classification Search ........................ None
See application file for complete search history.

(56) References Cited

U.S. PATENT DOCUMENTS

| | | | |
|---|---|---|---|
| 5,561,577 A * | 10/1996 | Motley | 361/56 |
| 7,217,966 B1 | 5/2007 | Vaschenko et al. | |
| 2004/0136127 A1 * | 7/2004 | Kodama et al. | 361/56 |

* cited by examiner

*Primary Examiner* — Evan Pert
*Assistant Examiner* — Scott Wilson
(74) *Attorney, Agent, or Firm* — Volpe and Koenig, P.C.

(57) ABSTRACT

The present invention provides an ESD device to reduce the total triggering current without increasing the overshoot voltage. This is achieved by localizing the triggering current, such that the local current density remains high enough to trigger the ESD device. This localized triggering provides a fast and efficient triggering of the ESD device.

30 Claims, 13 Drawing Sheets

LOCALIZED TRIGGER ESD PROTECTION DEVICE

CROSS-REFERENCES

This application claims the benefit of U.S. Provisional Application Ser. No. 60/956,166 filed Aug. 16, 2007, entitled, "Improved SCR Layout By Localized Trigger", U.S. Provisional Application Ser. No. 60/956,962 filed Aug. 21, 2007, entitled, "Improved SCR Body For Fast ESD Events" and U.S. Provisional Application Ser. No. 60/956,972 filed Aug. 21, 2007 entitled, "Improved Diode Layout With Local Gate", the entire contents of which are incorporated herein by reference.

FIELD OF THE INVENTION

The present invention generally relates to Electro Static Discharge (ESD) protection circuit. More specifically, the present invention relates to an improved ESD circuit with localized triggering.

BACKGROUND OF THE INVENTION

During ESD, large currents can flow through an Integrated Circuit (IC), potentially causing damage. To avoid this damage, protection circuits are added. One widely used ESD protection device is the Silicon Controlled Rectifier (SCR).

As typical SCR 100 as known in the art is illustrated in FIG. 1 exemplifying both a top view of and a cross section view along line A. The SCR 100 consists of two bipolar transistors, which are coupled such that during ESD operation they form a positive feedback loop. The first bipolar is a PNP, the bipolar emitter of which is the SCR anode 102, the bipolar base is known as the SCR trigger tap G2 104. The second bipolar is an NPN, the emitter of which is the SCR cathode 106, the bipolar base is the SCR trigger tap G1 108. The collector of the PNP and the base of the NPN is the same region. Also, the collector of the NPN and the base of the PNP is the same region.

One of the main advantages of the SCR is its high current handling capability. One of the main disadvantages of the SCR is its limited triggering speed, which might be too slow for very fast ESD events. The SCR can be used in a variety of configurations. In one configuration, it is triggered by the junction breakdown of the PNP base-collector junction, which is the same as the NPN collector-base region. In another configuration, the rising edge of the ESD event might trigger the SCR due to capacitive current flowing through both base-collector junctions.

The most important type of triggering, however, consists in applying a triggering signal at either the G1 trigger tap or the G2 trigger tap, or both. By increasing the voltage at the G1 tap, current will flow through the G1-cathode diode, which will trigger the SCR. Similarly, by decreasing the voltage at the G2 trigger tap, current will flow through the anode-G2 region, triggering the SCR.

Another widely used ESD device is a diode. In many ESD protection circuits a chain of diodes is used. However, during very fast ESD events, a voltage overshoot is associated with every diode. When placing N diodes in series, this overshoot is approximately multiplied by N. If this overshoot is significant, sensitive nodes in the circuitry (e.g. gate oxides) might be degraded or damaged during the ESD event.

Different implementations of diodes include gated diodes, STI diodes and Non-STI diodes. A top view and a cross section view along line B of a typical gated diode 200 is shown in FIG. 2. The diodes 200 include a N-well diode 202 of N-doped/N+ region 201 and a P-doped/P+ (anode) region 203 formed on a N-well region 204. The diodes 200 also include a P-well or P-substrate diode 206 having the N+ (cathode) region 205 and the P+ region 207 in a P-well or P-substrate 208. A local gate 210, such as a poly-gate, is placed between junction of the N+ 201 and P+ 203 and between the junction of N+ 205 and the P+ 207. This poly-gate 210 extends to a full width of the SCR. This gated diode 200 is fast, but adds more capacitance to the device due to the gated region extending through the full width of the diode. This helps in terms of reducing the overshoot voltage but at the same time adds more capacitance, which makes it difficult to use gated diodes in RF applications.

A typical STI diode 300 as shown in FIG. 3 is similar to the diode 200 except it does not include a poly-gate. The removal of the poly-gate provides a low capacitance to the device, but it has in most cases lower triggering speed, thus making these STI diodes less efficient for very fast ESD events. The STI diode 300 instead provides an isolation 302 between the junction of the N+ 201 and the P+ 203 and between the junction of the N+ 205 and the P+ 207. A typical Non-STI diode 400 as shown in FIG. 4 is similar to the STI diode 300 except it does not include the isolation 302 as described above. However this lack of isolation often leads to high leakage current.

Thus, there is a need in the art to provide an improved ESD protection device that overcomes the disadvantages of the prior art and provides for a fast triggering while reducing the overshoot voltage.

SUMMARY OF THE INVENTION

The present invention provides an electrostatic discharge (ESD) protection device comprising at least one anode formed within a first lightly doped region and at least one cathode formed within a second lightly doped region. The at least one region is formed only in a portion of at least one of the anode and the cathode to provide localized current to trigger the device.

In one embodiment; the region in the anode comprises of at least one extension of the anode and region in the cathode comprises of at least one extension of the cathode.

In another embodiment, the region is a gate region.

In yet another embodiment, the device is an SCR.

In yet another embodiment, the device is a diode.

The present invention also provides an electrostatic discharge (ESD) protection device comprising at least one anode formed within a first lightly doped region and at least one cathode formed within a second lightly doped region. The at least one region is partly formed in a portion of one of the first lightly doped region and the second lightly doped region.

DETAILED DESCRIPTION OF THE INVENTION

The present invention relates to a novel means to increase the speed of the SCR. SCR devices typically trigger in one point, after which the current spreads over the full SCR width. Since (dI/dt), instantaneous rate of current change, is one of the limiting factors for SCR triggering speed, triggering the SCR at lower absolute current speeds up triggering. To achieve this, the present invention provides an ESD device to reduce the total triggering current without increasing the resistance (i.e. increasing overshoot voltage) of the trigger path. This is achieved by localizing the trigger current, such that the local current density remains high enough to trigger the SCR, details of which are provided in greater detail below.

Figure 5:
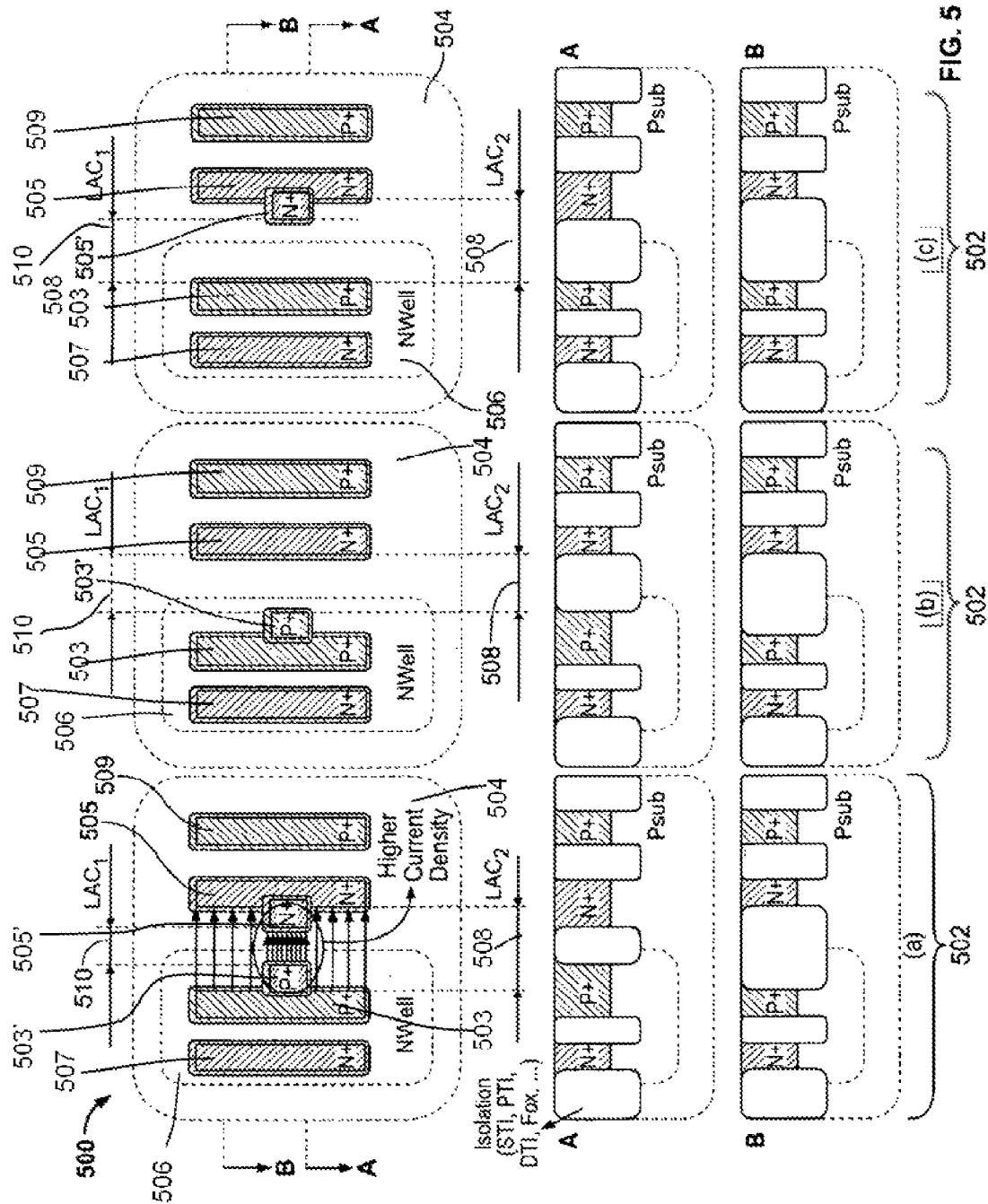
FIG. 5 illustrates an SCR device in accordance with one embodiment of the present invention.

Referring to FIG. 5, there is shown a top view of the ESD devices 500 and the corresponding cross-section views along lines A and B. The ESD devices 500 include SCRs 502 formed on a substrate of material of first conductivity type, preferably a p-type doping region (P-sub) 504. As shown in FIG. 5, a well 506 of a second conductivity type, preferably an n-type doping region (N-well) is formed in the P-sub 504. Both N-well 506 and P-sub 504 may include semi-conducting material, such as, for example, silicon, germanium or combinations of both. P-sub 504, as shown in FIG. 5, may preferably be electrically grounded. Even though in the embodiment of the present invention, the first conductivity type is defined as a p-type doping region and the second conductivity type is defined as an n-type doping region, one skilled in the art would appreciate that the first conductivity type may be the n-type doping region and the second conductivity type may be the p-type doping region.

In particular, the SCR 502 includes an anode 503 (P+ region in N-well), which is connected to a pad (not shown) and to one side of a resistance of the N-well 506 or an external resistor. The SCR 502 also includes a cathode 505 (N+ region in P-sub) which is connected to a ground (not shown) and to one side of a resistance of the P-well 504 or an external resistor. A G2 tap 507 is a N+ in the N-well 506 and a G1 tap 509 is a P+ in the P-well 504. The SCR 502 further includes an extension, P+ 503' of the anode 503 and an extension, N+ 505' of the cathode 505. As illustrated in FIG. 5, a second LAC, i.e. $LAC_2$ 508 is a spacing between the anode 503 and the cathode 505. A first LAC, i.e. $LAC_1$ 510 is a smallest anode to cathode spacing. Various embodiments of the LAC1 510 are illustrated in FIG. 5. FIG. 5a shows an extension P+ 503' of the anode 503 and an extension N+ 505' of the cathode 505. In this example, the extensions 503' and 505' of the anode and the cathode are placed at the same position along the width of the axis of the device to provide for the minimum $LAC_1$ So, the LAC, 510 is between the extensions P+ 503' and N+ 505'. FIG. 5b illustrates an embodiment with $LAC_1$ 510 between the extension P+ 503' and the cathode 505. FIG. 5c illustrates an embodiment with $LAC_1$ between the extension N+ 505' and the anode 503. Although not shown, the extensions 503' and 505' can preferably be placed at other locations. Some examples include extensions 505' and 505' placed centrally along the width axis of the anode and cathode respectively, or alternatively positioned at one of upwards and downwards along the width of the axis of the anode and cathode respectively.

As known in the art, the trigger current flows uniformly spreading over the total width of the SCR device, thus requiring more time for the SCR to trigger. In the embodiment of the present invention, the trigger current flows in the horizontal direction and the width of the device is in the vertical direction as illustrated in FIG. 5a. The smallest anode to cathode spacing, $LAC_1$ 510 is localized at a specific part of the SCR, where the LAC for the rest of the SCR, i.e. $LAC_2$ 508 is larger. This forces the first trigger current to localize at the smallest LAC point, i.e. at $LAC_1$ 510. By localizing the specific part of the SCR, relatively more trigger current will flow in this $LAC_1$ 510. As illustrated in FIG. 5a, the $LAC_1$ 510 is spacing between the extensions 505' and 505'. The resistance locally at LAC, 510 becomes lower so more trigger current will flow between the extensions 503' and 505' as shown in FIG. 5a. In this way the trigger path is localized such that the necessary current density will be reached very quickly, while the total absolute current is still relatively low, thus making it trigger faster.

Figures 1, 2:
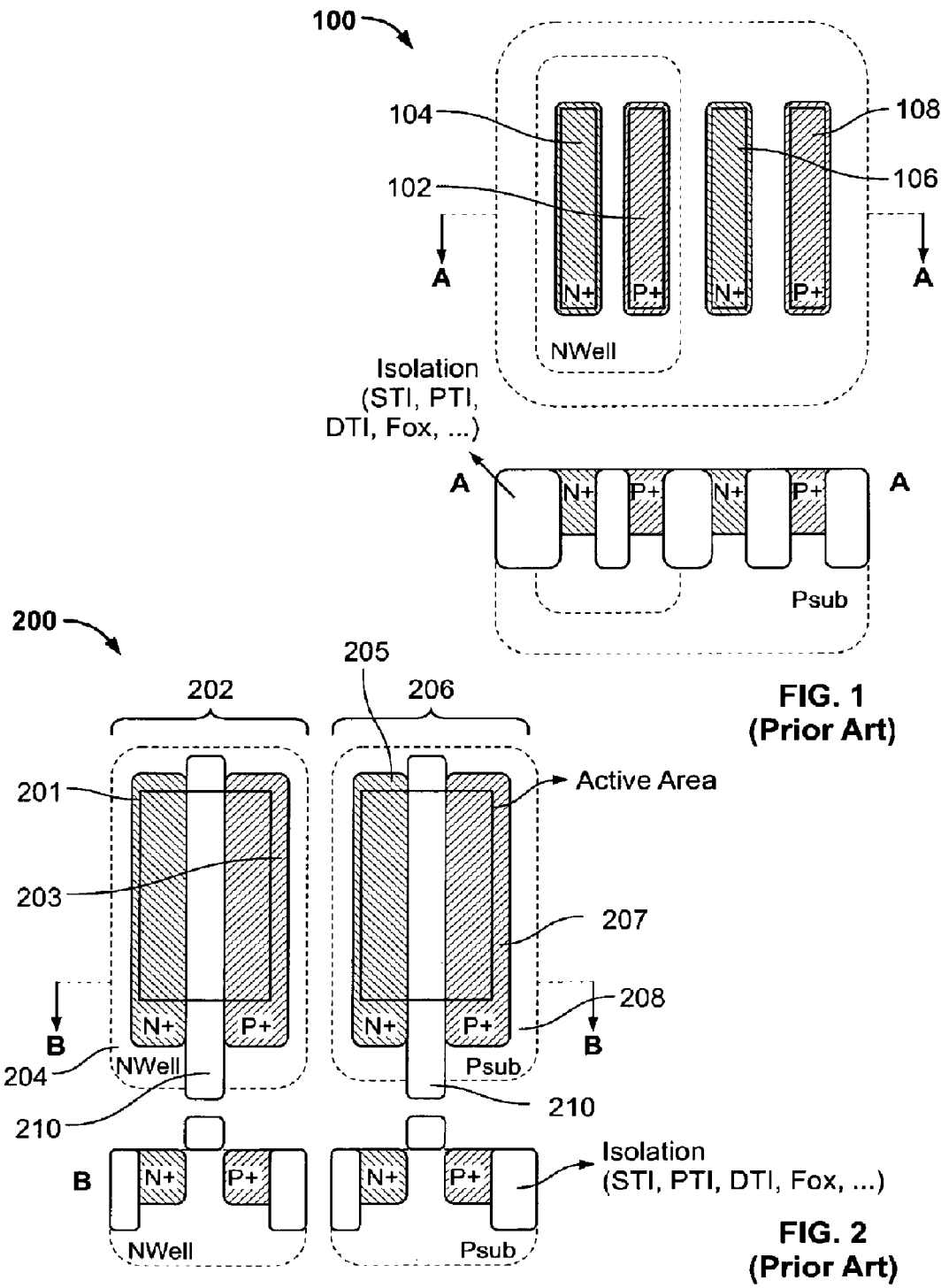
FIG. 1 illustrates a prior art SCR in accordance with the present invention.
FIG. 2 illustrates a prior art gated diode in accordance with the present invention.
Figure 3:
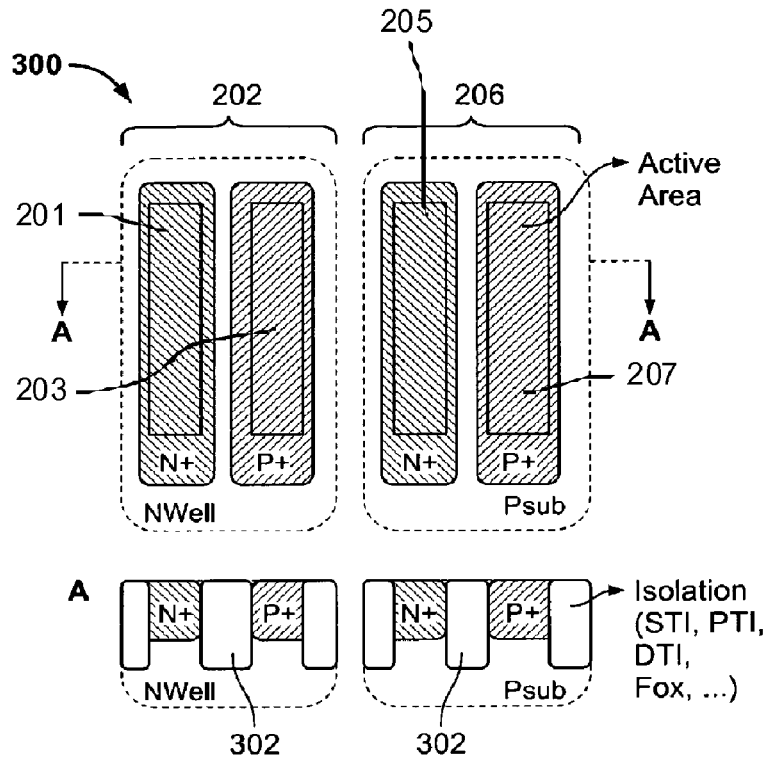
FIG. 3 illustrates a prior art STI diode in accordance with the present invention.
Figure 4:
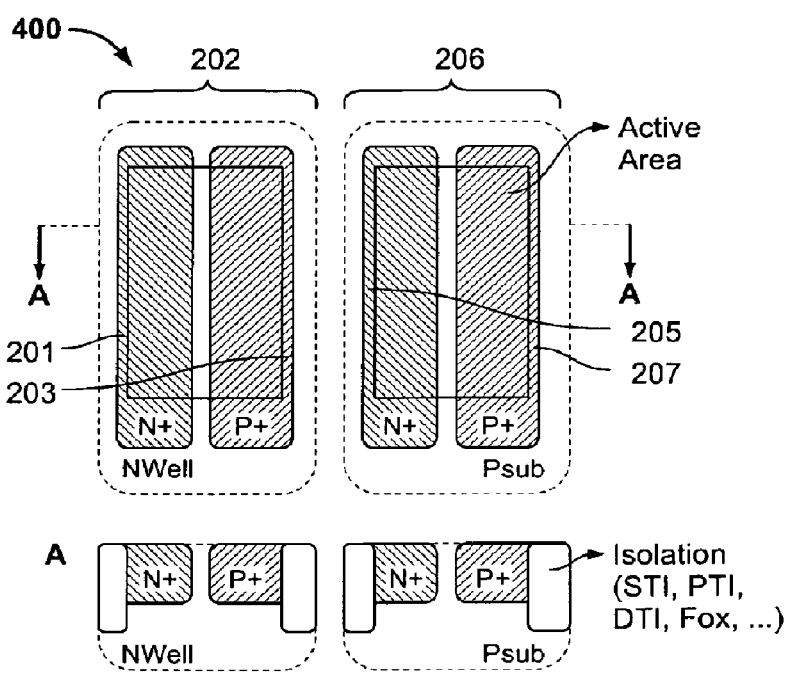
FIG. 4 illustrates a prior art NON-STI diode in accordance with the present invention.

Additionally, it is known in the art to place some type of isolation such as shallow trench isolation (STI) between the active regions. However in the embodiments of the present invention, the isolation is removed to provide a shorter current path between anode and cathode, thus creating a lower resistance. Also, by reducing the spacing between the anode and the cathode with their corresponding extensions creates a bipolar transistor and further lowers the resistance Note that $LAC_{min}$ can be based either on a minimum design rule or smaller than the rule or even larger than the rule. Even though FIG. 5 illustrates the extensions P+ 503' and the N+ 505' which create the reduced $LAC_1$ being placed in the middle of the anode and the cathode respectively, it obvious to one skilled in the art that these extensions can be placed anywhere along the anode and/or cathode width. Although the extensions, as illustrated in FIG. 2, are rectangular, the invention is not limited to any particular shape and number of the extensions.

Figure 6:
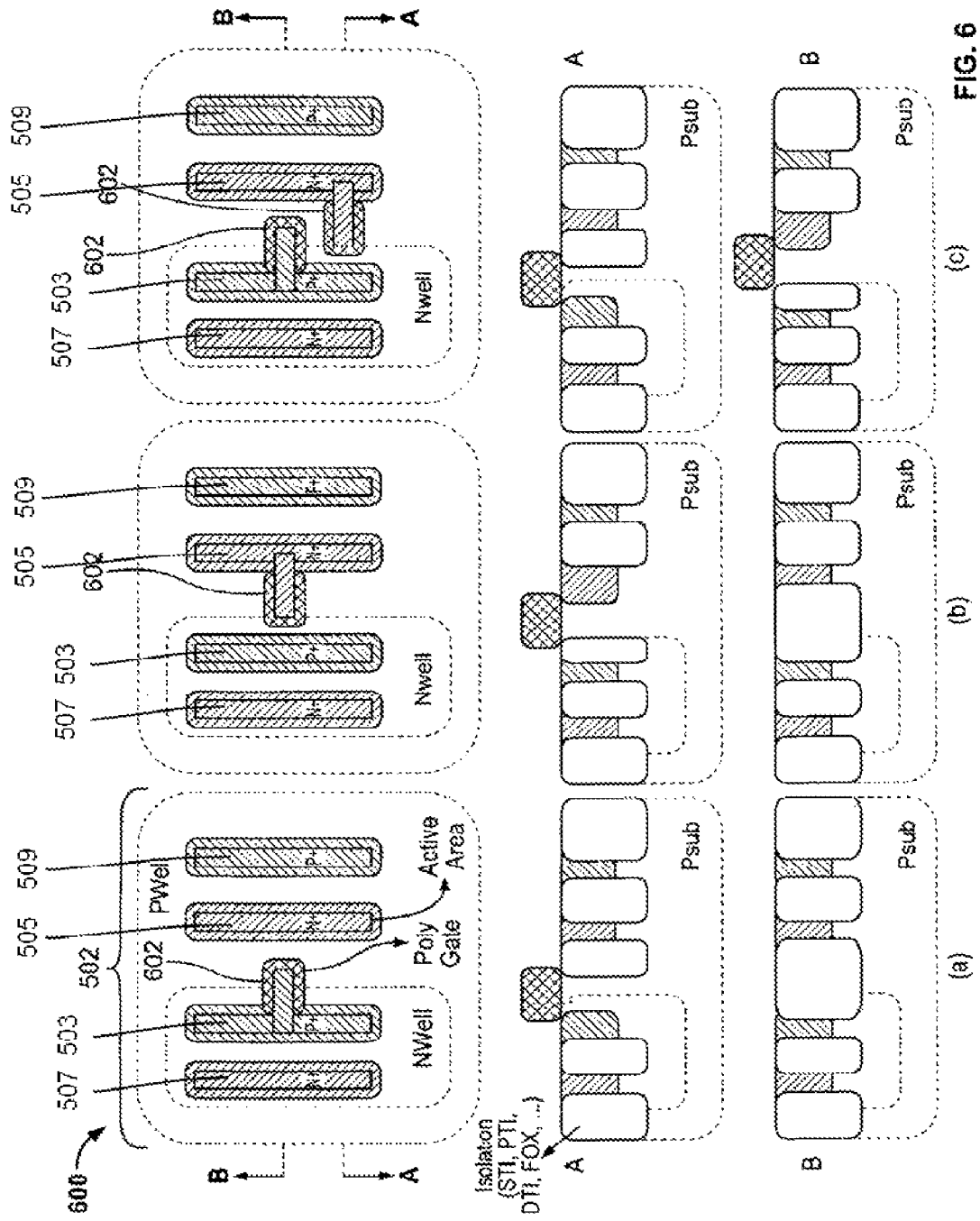
FIG. 6 illustrates an SCR device in accordance with another embodiment of the present invention.

Referring to FIG. 6, there is shown an ESD device 600 according to another embodiment of the present invention. In this embodiment instead of the P+ extension 503' and N+ extension 505' in ESD device 500 of FIG. 5a, a local gate region 602, for example a poly gate is added at a certain area of the active regions of the ESD device. The gate region 602 preferably comprises of polycrystalline silicon (polysilicon) over an active area as shown in FIG. 6. Active area comprises of an area of high doped regions excluding isolation. Some types of isolations include STI, DTI, PTI, field oxide etc. The gate region 602 also may preferably comprise a poly over the isolation. In further implementations, the active area may also be needed between the anode 503 and the cathode 505 as will be described with reference to FIG. 7 below. Referring to FIG. 6a, it illustrates the gate region 602 added at the anode 503. FIG. 6b illustrates the gate region 602 added to the cathode 505 and FIG. 6c illustrates the local gates 602 added to only a certain small areas of both the anode 603 and the cathode 605. Thus, in this example, the width of the poly is reduced. As known in the prior art, the poly-gates are generally placed at the full width of the SCR in which case the current flows homogeneously over the whole width. Thus, in order to prevent the spreading of this current over the whole width, the poly-gates 602 are added only at specific active regions to reduce its width. So, the widths of the poly-gates 602 are lower than the width of the anode 503 and the cathode 505 and widths of the poly-gates 602 are lower than the length of the G1 and G2. This localizes the current within the poly-gates 602 during turn on the SCR. Thus, the local gates also functions to allow for more trigger current to flow at this localized part of the SCR. Thus these local gates 602 have similar effect as the extensions discussed above that the current is localized and as such the current density needed for triggering is reached fro a lower absolute total amount of current. Also, the current path is shorter also because it does not have to go under the STI isolation. Even though FIG. 6 illustrates only one local gate 602 at each active region, it is obvious to one skilled in the art that more than one local gate can be placed at each active region as long as the current is localized.

Figure 7:
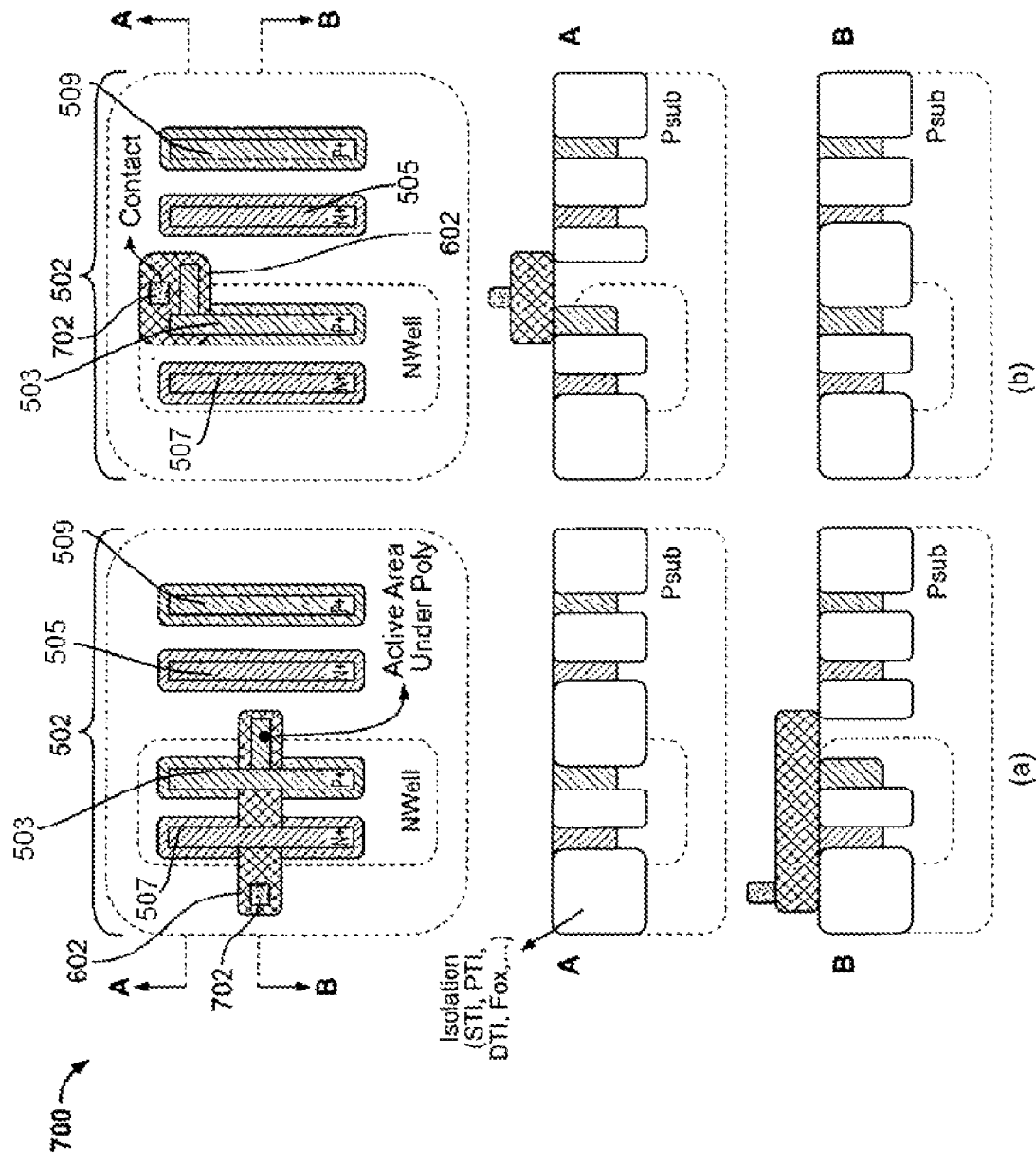
FIG. 7 illustrates an SCR device of FIG. 6 with an alternate embodiment of the present invention.

FIG. 7 illustrates and ESD device 700 in yet another embodiment by placing a certain potential to the local gates 602 of FIG. 6. This is achieved by adding gate contacts 702 on the local gates 602 as illustrated in FIG. 6. The gate contacts 702 may preferably be connected to a biasing circuit (not shown) to provide a certain potential to the local gates 602, which in turn aids in triggering of the SCR. As an example, FIG. 7a illustrates the local gate 602 extends beyond the anode 503. Although, not shown, the local gate 602 may also extend beyond the cathode 505. FIG. 7b illustrates another example of the local gate 602 extending between the anode 503 and part of the P-sub 504. Although, FIG. 7 illustrates placing contacts 702 at certain portions of the local gates 602, the present invention is not limited in any way with respect to the location of the contacts on the local gates. Additionally, as illustrated in example of FIG. 7a, the active area is also needed between the anode 503 and the cathode 505, otherwise there is isolation between anode and cathode.] However, it is not necessary to have the active area for the poly gate 602 which in this example extends beyond the anode 503 over G2 tap 507 in order to place the contacts 702. This is because the current will be conducted by poly itself through the anode 503.

Figure 8:
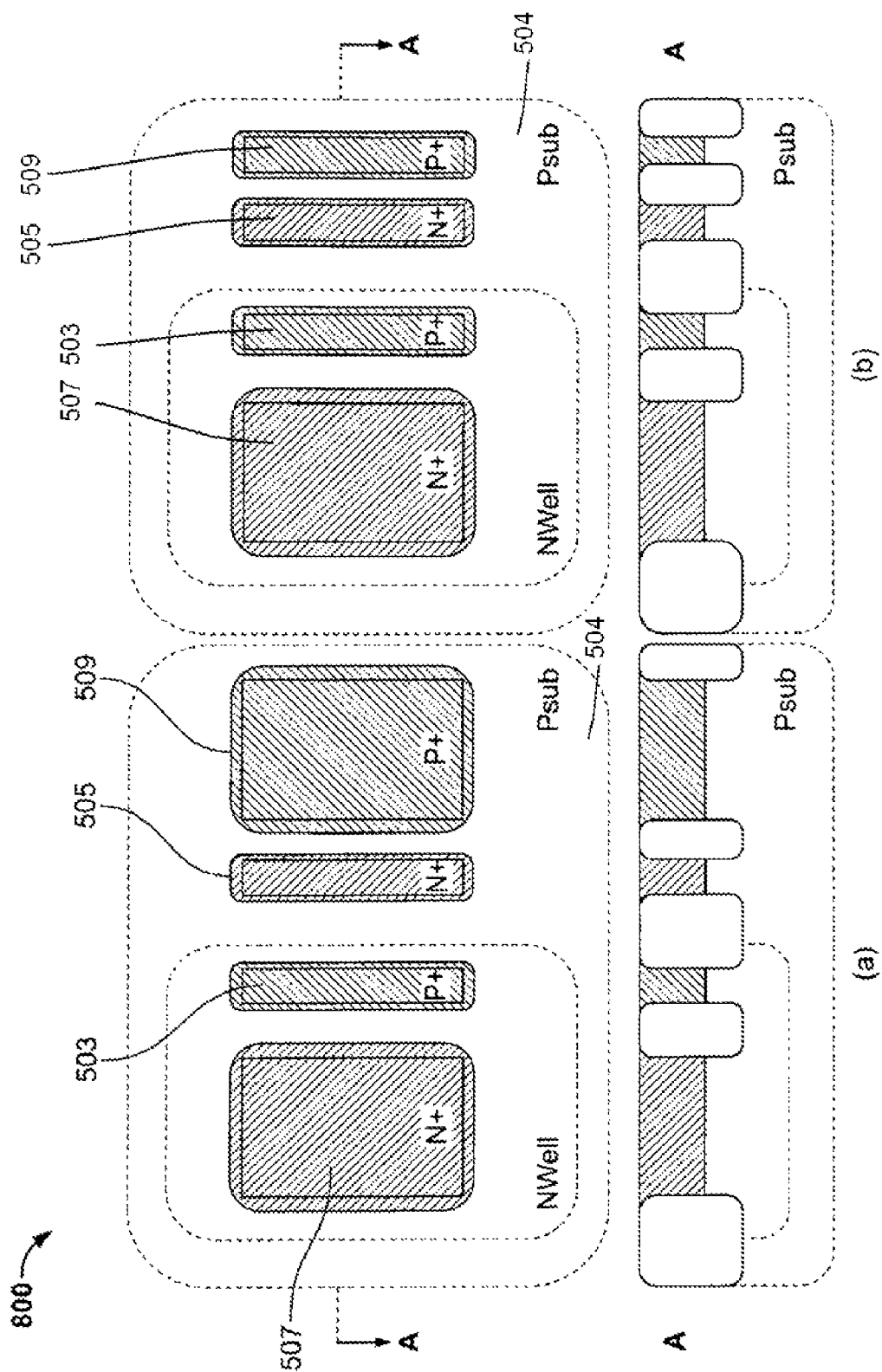
FIG. 8 illustrates an SCR device in accordance with yet another embodiment of the present invention.

In another embodiment (FIG. 8) of the present invention, there is illustrated an ESD devices 800 similar in accordance with another embodiment of the present invention. In the ESD device 800, $LAC_1$ is achieved by increasing the length of both the trigger G1 509 in N-well 506 and trigger tap G2 507 in P-sub 504. So, the lengths of GI 509 and G2 507 are increased more than needed in order to be able to carry the trigger current, such significantly reducing the overshoot voltage. In the example illustrated in FIG. 8a, the length of the G1 509 is larger than the length of the cathode 505 and the length of the G2 507 is larger than the length of the anode 505 measured along the axis orthogonal onto width axis of the device. Similarly, the length of the anode 503 and cathode 505 can be decreased. In another example, in FIG. 8b, only the length of the G2 507 is increased. Although not shown, alternatively, only the length of the G1 509 may be increased.

Figure 9:
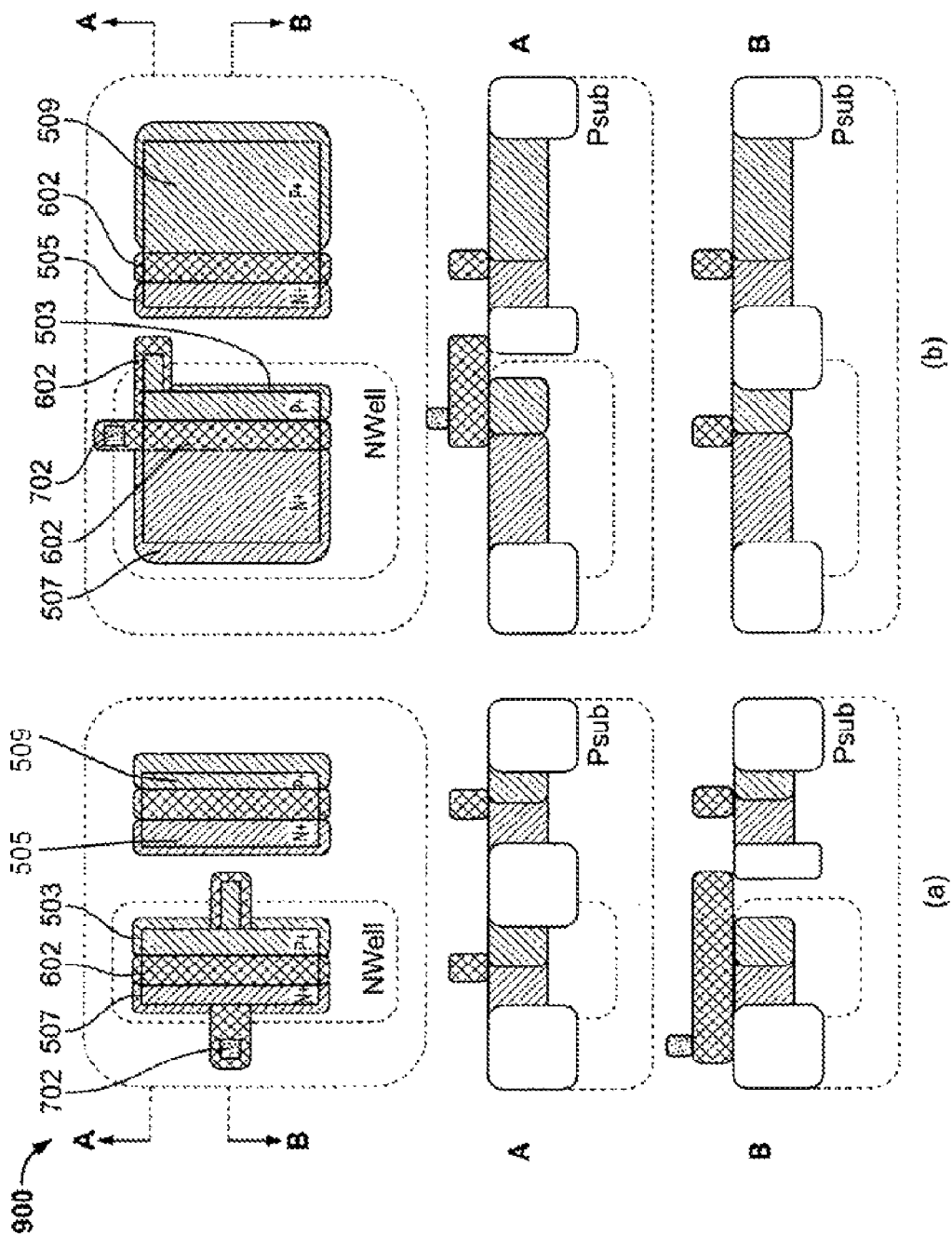
FIG. 9 illustrates SCR devices in accordance with various combinations of the SCR devices of FIGS. 6, 7 and 8.

FIG. 9 illustrates an ESD device 900 with various other examples of combinations of the poly gates 602 and the contacts 702. FIG. 9a shows an example with the poly gate 602 at each of the anode 503 and G2 tap 507 with the gate contact 702 at the G2 tap 507 and a poly gate 602 extending between the anode 503 and the G2 tap 507. Also shown is another poly gate 602 extending between the cathode 505 and the G1 tap 509. FIG. 9b shows an example with the poly gate 602 extending between the anode 503 and the G2 tap 507 with the gate contact at the N-well 506. FIG. 9b also shows another poly gate 602 extending between the cathode 505 and the G1 tap 509. Also, note in FIG. 9b, the length of the G1 509 is larger than the length of the cathode 505 and the length of the G2 507 is larger than the length of the anode 503. It is obvious to one skilled in the art that the invention is not limited to the combinations illustrated in FIG. 9.

Figure 10:
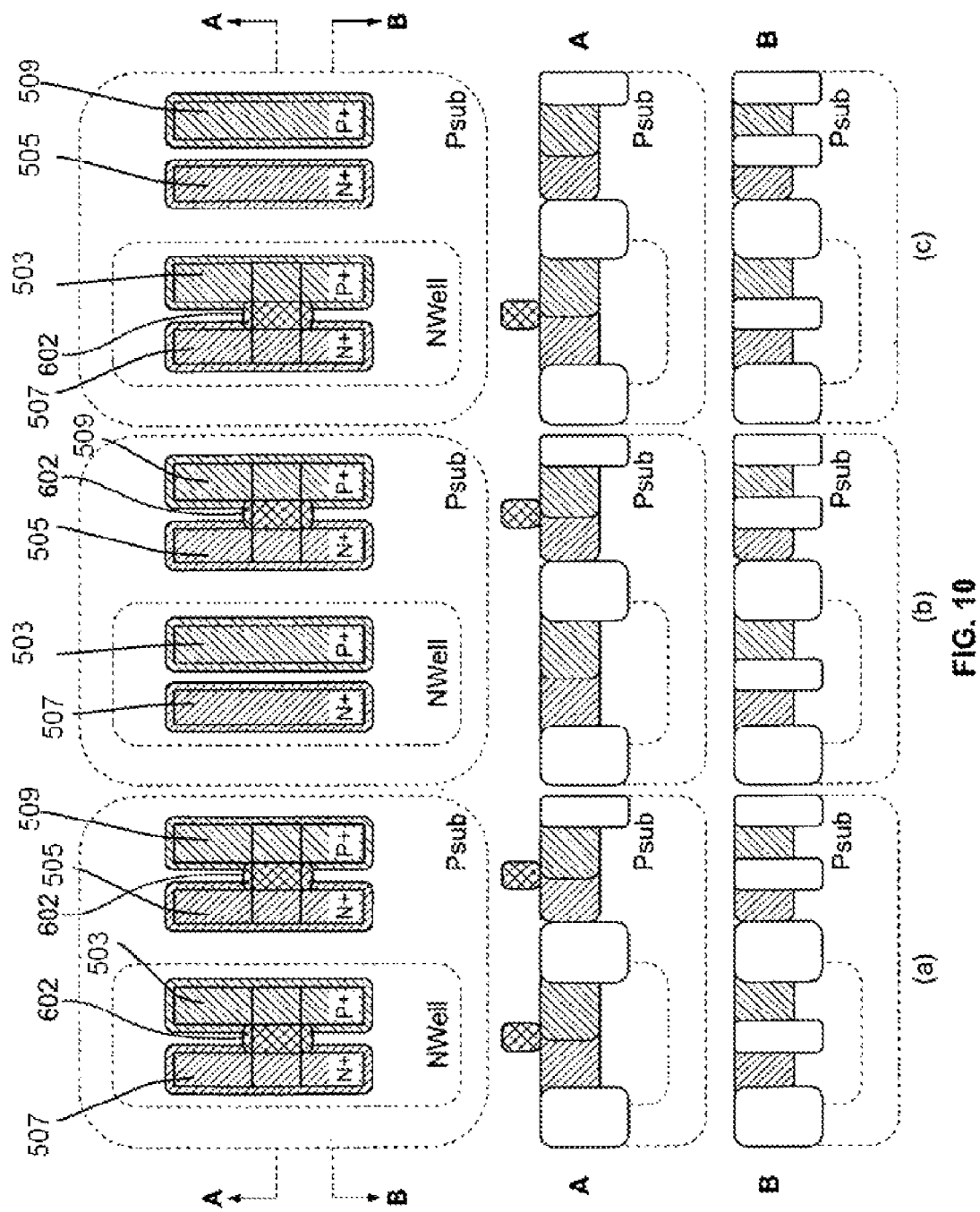
FIG. 10 illustrates SCR devices in accordance with various combinations of the SCR devices of FIG. 6.

FIG. 10 illustrates some other embodiments of adding poly-gates 602. FIG. 10a illustrates an implementation in which the poly-gate 602 is added at a junction between the anode 503 and the G2 507 and a junction between the G1 509 and the cathode 505. A second implementation is depicted in FIG. 10b in which the poly-gate 602 is added only at the cathode-G1 (505-509) junction. A third implementation is depicted in FIG. 10c in which the poly-gate 602 is added only at the anode-G2 (503-507). In these embodiments, the poly-gate 602 is small and does not extend over the full width of the SCR 502.

Figure 11:
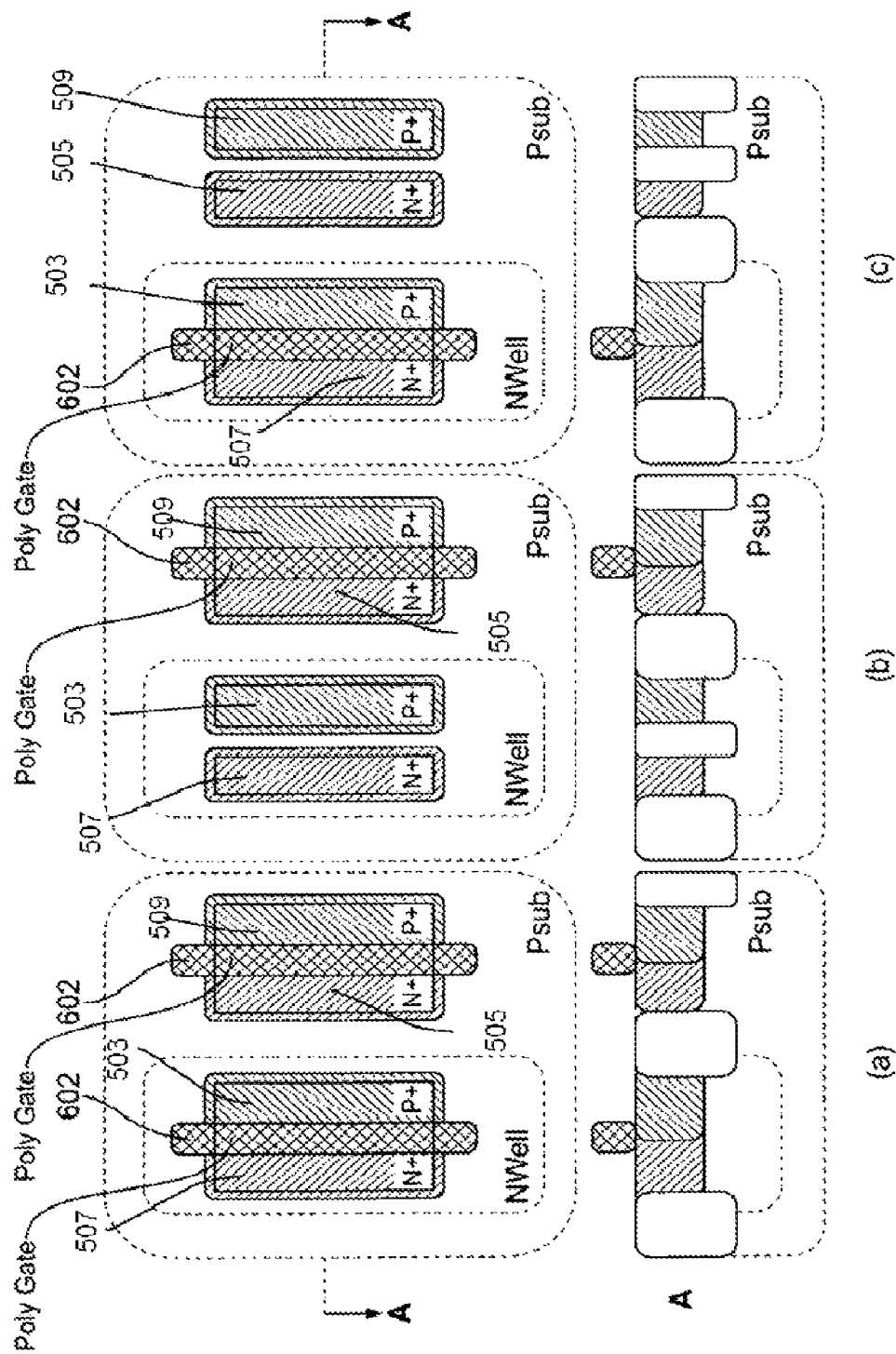
FIG. 11 illustrates an SCR device in accordance with yet another embodiment of the present invention.

In yet another embodiment, as illustrated in FIG. 11a, there is shown a poly-gate 602 added over the total width of the device at the junction between the anode 503 and the G2 507 and another poly-gate 602 added over the total width of the device at the junction between the cathode 505 and the G1 509. Alternatively, as shown in FIGS. 11a and 11b, only one poly gate 602 is added between the cathode-G1 (505-509) junction and between the anode-G2 (503-507) junctions respectively. As noted above, in these examples also the width of the poly 602 can be reduced and can be placed anywhere along the width axis of the device. Even though FIGS. 11a, 11b and 11c illustrate the use of only one poly gate 602 between the junctions, it is obvious to one skilled in the art that more than one poly gate 602 can be placed at these junctions as long as the current is localized.

Figure 12:
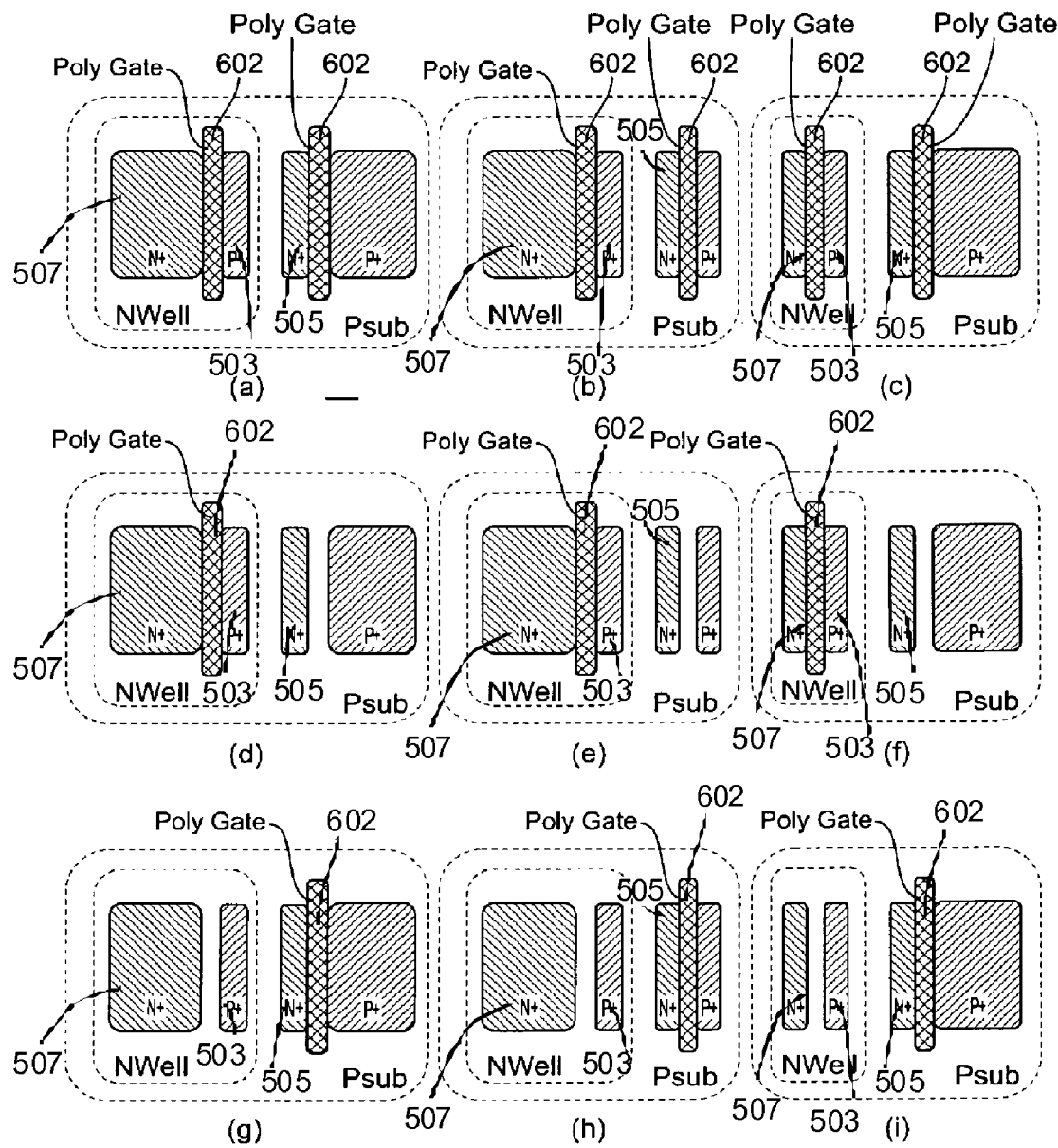
FIG. 12 illustrates SCR devices in accordance with various combinations of the SCR devices of FIGS. 8 and 11.

FIGS. 12a through 12i illustrate combinations of various implementations of the SCR devices with poly-gates over the total device width. FIG. 12a illustrates a poly-gate 602 of the increased width placed both at the cathode-G1 (505-509) junction and the anode-G2 (503-507) junction in which both the lengths of G1 509 and G2 507 are increased. In other words, the length of the G1 509 is larger than the length of the cathode 509 and the length of the G2 507 is larger than the length of the anode 503. FIG. 12b illustrates a poly-gate 602 of an increased width placed both at the cathode-G1 (505-509) junction and the anode-G2 (503-507) junction in which only the length of G2 507 is increased. FIG. 12c illustrates a poly-gate 602 of an increased width placed both at the cathode-G1 (505-509) junction and the anode-G2 (503-507) junction in which only the length of G1 509 is increased.

FIG. 12d illustrates a poly-gate 602 of an increased width placed only at the anode-G2 (503-507) junction in which both the lengths of G1 509 and G2 507 are increased. FIG. 12e illustrates a poly-gate 602 of an increased width placed only at the anode-G2 (503-507) junction in which only the length of G2 507 is increased. FIG. 12f illustrates a poly-gate 602 of an increased width placed only at the anode-G2 (503-507) junction in which only the length of G1 509 is increased. Alternatively, FIG. 12g illustrates a poly-gate 602 of an increased width placed at the cathode-G1 (505-509) junction in which both the lengths of G1 509 and G2 507 are increased. FIG. 12h illustrates a poly-gate 602 of an increased width placed at the cathode-G1 (505-509) junction in which only length of G2 507 is increased. FIG. 12i illustrates a poly-gate 602 of an increased width placed at the cathode-G1 (505-509) junction in which only the length of the G1 509 is increased.

Figure 13:
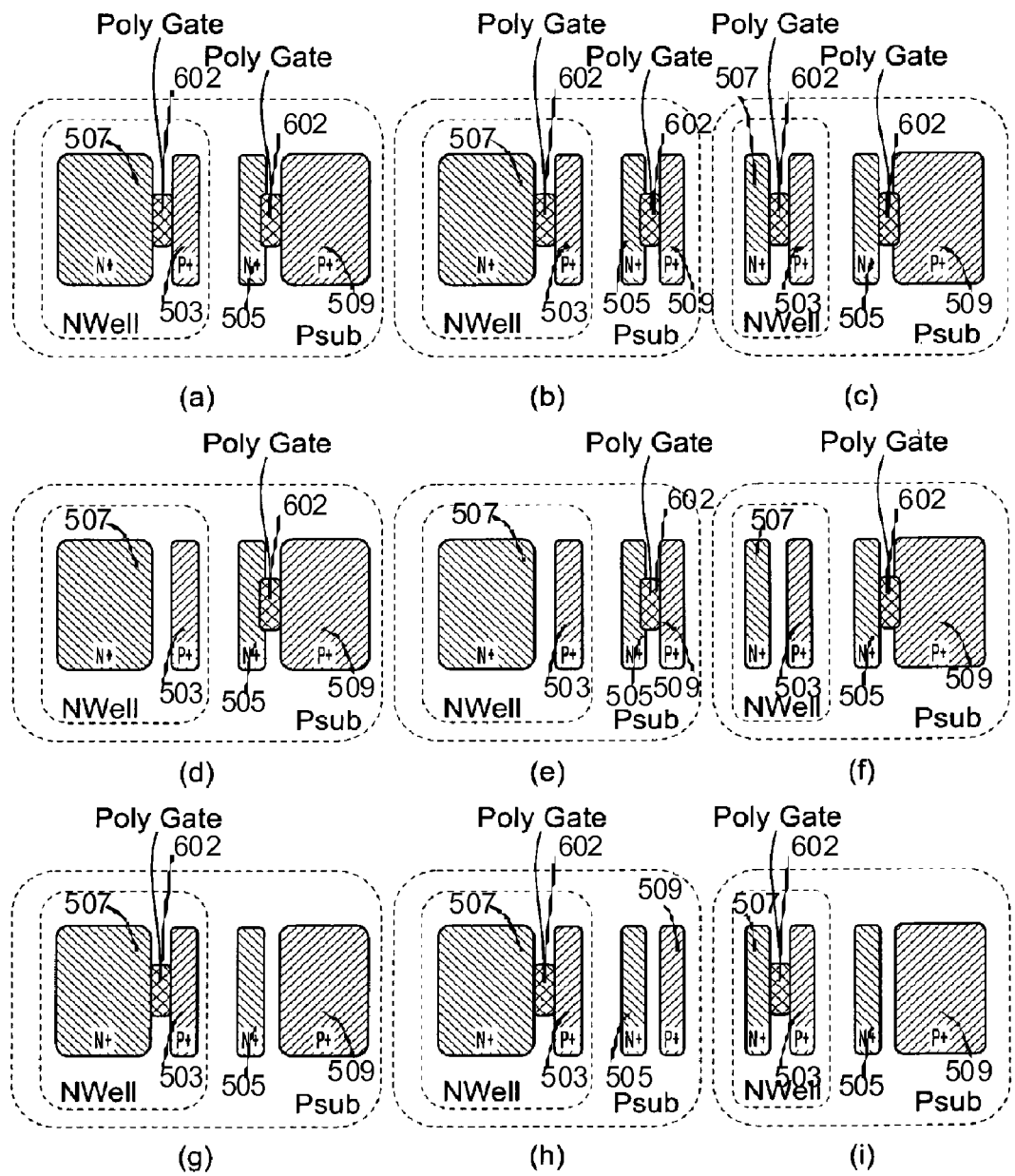
FIG. 13 illustrates SCR devices in accordance with various combinations of the SCR devices of FIGS. 6 and 8.

FIGS. 13a through 13i illustrate combinations of the various implementations of the SCR devices of the poly-gates of the reduced width. FIG. 13a illustrates a poly-gate 602 of the reduced width placed both at the cathode-G1 (505-509) junction and the anode-G2 (503-507) junction in which both the lengths of G1 509 and G2 507 are increased. FIG. 13b illustrates a poly-gate 602 of a reduced width placed both at the cathode-G1 (505-509) junction and the anode-G2 (503-507) junction in which only the length of G2 507 is increased. FIG. 13c illustrates a poly-gate 602 of the reduced width placed both at the cathode-G1 (505-509) junction and the anode-G2 (503-507) junction in which only the length of G1 509 is increased.

FIG. 13d illustrates a poly-gate 602 of the reduced width placed only at the cathode-G1 (505-509) junction in which both the lengths of G1 509 and G2 507 are increased. FIG. 13e illustrates a poly-gate 602 of an increased width placed only at the cathode-G1 (505-509) junction in which only the length of G2 507 is increased. FIG. 13f illustrates a poly-gate 602 of an increased width placed only at the cathode-G1 (505-509) junction in which only the length of G1 509 is increased. Alternatively, FIG. 13g illustrates a poly-gate 602 of a reduced width placed at the anode-G2 (503-507) junction in which both the lengths of G1 509 and G2 407 are increased. FIG. 13h illustrates a poly-gate 602 of a reduced width placed at the anode-G2 (503-507) junction in which only length of G2 507 is increased. FIG. 13i illustrates a poly-gate 602 of a reduced width placed at the anode-G2 (503-507) junction in which only the length of the G1 509 is increased.

Figure 14:
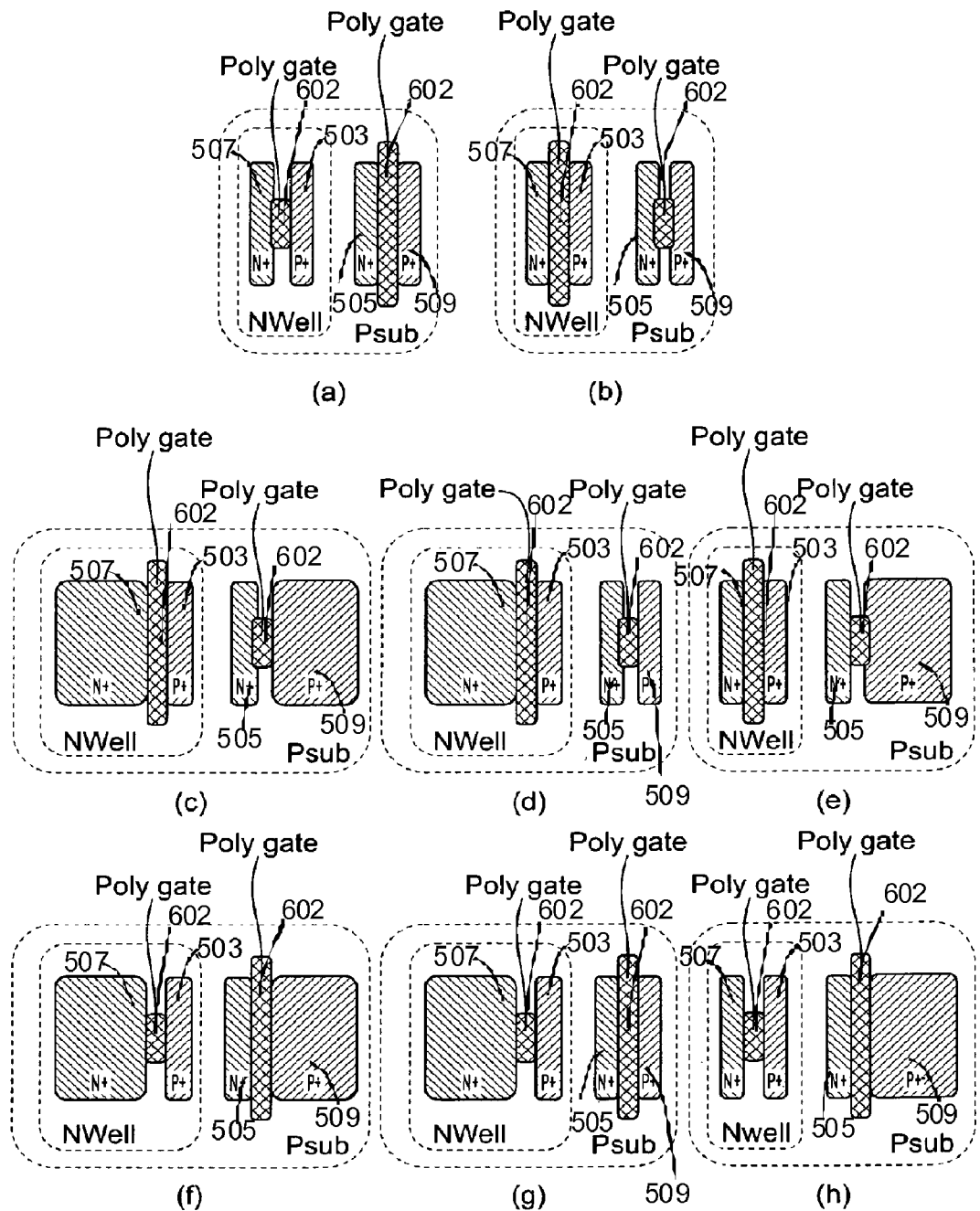
FIG. 14 illustrates SCR devices in accordance with various combinations of the SCR devices of FIGS. 6 and 8 and 11.

FIGS. 14a through 14h illustrate combinations of the various implementations of the SCR devices of the poly-gates of both the increased and the reduced widths. FIG. 14a illustrates a combination of a poly gate 602 of a reduced width placed between the anode-G2 (503-507) junction and a poly gate 602 of an increased width placed between the cathode-G1 (505-509) junction. Alternatively, FIG. 14b illustrates a combination of a poly gate 602 of a reduced width placed between the cathode-G1 (505-509) junction and a poly gate 602 of an increased width placed between the anode-G2 (503-507) junction.

FIG. 14c illustrates a combination of a poly-gate 602 of the increased width placed between the anode-G2 (503-507) junction and the poly-gate 602 of the reduced width placed between the cathode-G1 (505-509) junction in which lengths of both the G1 509 and the G2 507 are increased. FIG. 14d illustrates a poly-gate 602 of the increased width placed between the anode-G2 (503-507) junction and the poly-gate 602 of the reduced width placed between the cathode-G1 (505-509) junction in which only the length of the G2 507 is increased. Alternatively, FIG. 14e illustrates a poly-gate 602 of the increased width placed between the anode-G2 (503-507) junction and the poly-gate 602 of the reduced width placed between the cathode-G1 (505-509) junction in which only the length of the G1 509 is increased.

FIG. 14f illustrates a combination of a poly-gate 602 of the reduced width placed between the anode-G2 (503-507) junction and the poly-gate 602 of the increased width placed between the cathode-G1 (505-509) junction in which lengths of both the G1 509 and the G2 507 are increased. FIG. 14g illustrates a combination of a poly-gate 602 of the reduced width placed between the anode-G2 (503-507) junction and the poly-gate 602 of the increased width placed between the cathode-G1 (505-509) junction in which only the length of G2 507 is increased. FIG. 14h illustrates a combination of a poly-gate 602 of the reduced width placed between the anode-G2 (503-507) junction and the poly-gate 602 of the increased width placed between the cathode-G1 (505-509) junction in which only the length of G1 509 is increased.

Even though figures in the present invention illustrate a one finger, one sided SCR, it is known to one skilled in the art that the present invention is not limited to any number of SCR fingers, nor to any specific SCR configuration.

Figure 15:
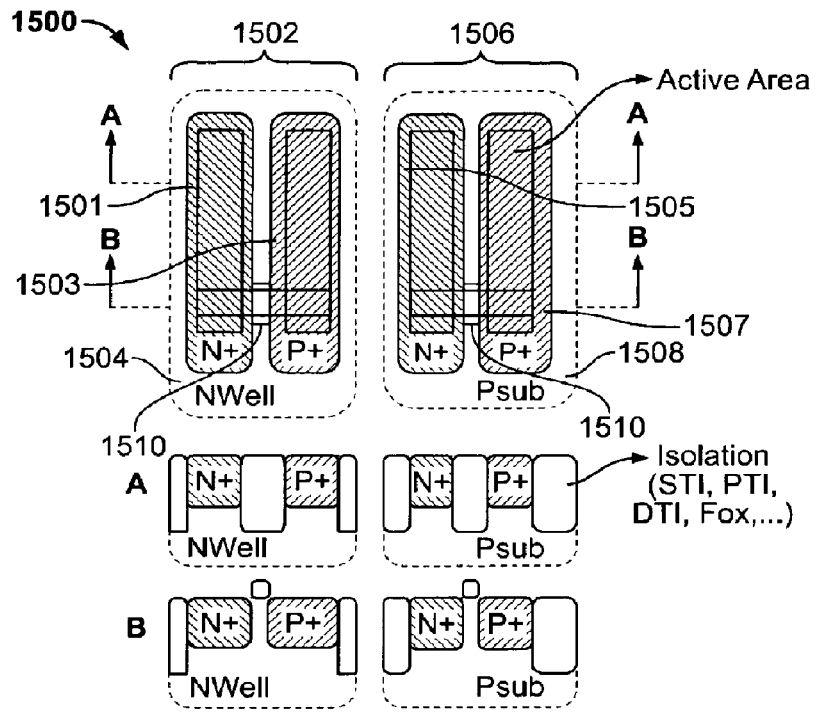
FIG. 15 illustrates a diode in accordance with yet another embodiment of the present invention.

In further embodiments of the present invention there is provided a novel means to increase the speed of the diode. FIG. 15 illustrates a top view of the ESD devices 1500 and the corresponding cross-section views along lines A and B. The ESD devices 1500 includes a N-well diode 1502 having N+ region 1501 and P+ region (anode) 1503 formed in a N-well region 1504. The device 1500 also includes a P-well diode 1506 having N+ region 1505 (cathode) and P+ region 1507 formed in a P-substrate 1508. Both the N-well 1504 and the P-sub 1508 may include semi-conducting material, such as, for example, silicon, germanium or combinations of both. P-sub 1508, as shown in FIG. 15, may preferably be electrically grounded. As illustrated in FIG. 15 a gate 1510 is added to only at certain small areas of both the anode 1503 and the cathode 1505 of each of the diodes 1502 and 1506 This reduces the width of the gate 1510 along the width axis of the device. So, by reducing the width of the gates 1510, only very limited amount of capacitance is added to the device. Furthermore, similar to the concept of the SCR as described above, the current is localized within the gates 1510 during turn on of the diode which increases the triggering speed of the diodes and limits the overshoot voltage.

Figure 16:
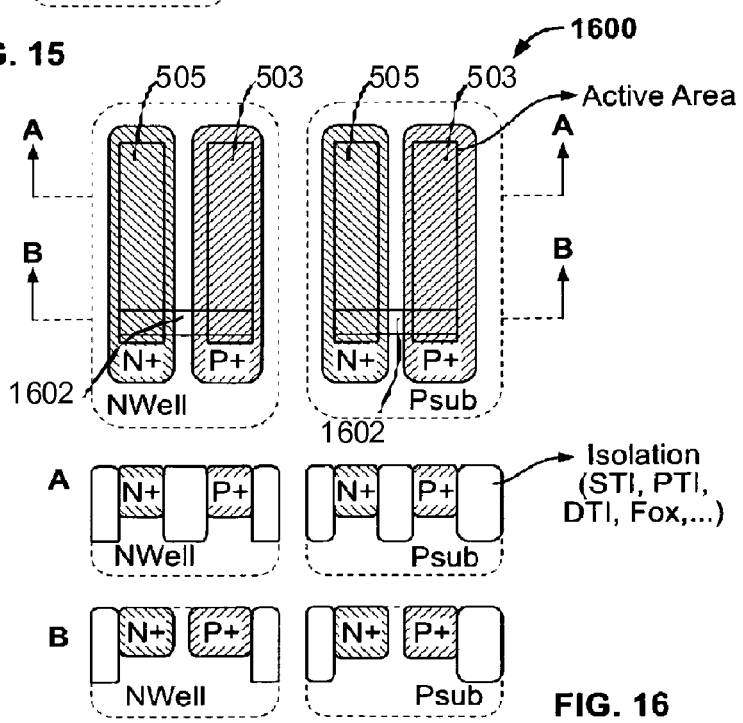
FIG. 16 illustrates a diode of FIG. 15 in accordance with an alternate embodiment of the present invention.

FIG. 16 illustrates a top view of the ESD devices 1600 and the corresponding cross-section views along lines A and B. The ESD device 1600 is similar to the ESD device 1500 as described above, however the ESD device 1600 also includes a very short NON-STI (blocking region for STI) region 1602 placed between the active regions, preferably between the anode and the cathode of the diodes. Due to the out-diffusion, the spacing between the anode 503 and the cathode 505 is reduced, providing a localized triggering path between the active regions, while only adding a limited amount of leakage current.

Although figures illustrated in the present invention do not show any triggering circuit, it is known to one skilled in the art that a triggering circuit can be connected to the G2 tap, the G1 tap or both. Also, the triggering circuit can consist of any combination of, but not limited to, diodes, resistors, capacitors, transistors, inductors etc. Thus, the present invention is not limited to any specific triggering circuit, nor is it limited to how this triggering circuit or the ESD clamp itself is connected to a sensitive circuit.

The above embodiments of the present invention as described above have common features of improving the triggering speed of the SCR by improving the triggering speed of either Anode-G2 diode, G1-cathode diode or both or triggering diodes and reducing the overshoot voltage.

Although various embodiments that incorporate the teachings of the present invention have been shown and described in detail herein, those skilled in the art can readily devise many other varied embodiments that still incorporate these teachings without departing from the spirit and the scope of the invention.

The invention claimed is:

1. An electrostatic discharge (ESD) protection device comprising:
    an anode formed within a first lightly doped region and a cathode formed within a second lightly doped region;
    wherein at least one of the anode and the cathode includes an extension to provide localized current to trigger the device; and wherein the extension is formed in only a portion of the at least one of the anode and the cathode.

2. The ESD device of claim 1 the extension is formed along a portion of the width axis of the device.

3. The ESD device of claim 2 comprising a first LAC and a second LAC; wherein said second LAC is a spacing between the anode and the cathode which is smaller than the second LAC and wherein the first LAC is one of:
a minimum spacing between the anode and the extension of the cathode,
a minimum spacing between the cathode and the extension of the anode, and
a minimum spacing between the extension of the anode and the extension of the cathode.

4. The ESD device of claim 3 wherein the anode includes an extension and the cathode includes an extension.

5. The ESD device of claim 4 wherein the extension of the anode is positioned centrally along the width axis of the anode and the extension of the cathode is positioned centrally along the width axis of the cathode.

6. The ESD device of claim 4 wherein the extension of the anode is positioned either upwards or downwards along the width axis of the anode and the extension of the cathode is positioned either upwards or downwards along the width axis of the cathode.

7. The ESD device of claim 4 wherein the first LAC is the spacing between the extension of the anode and the extension of the cathode.

8. The ESD device of claim 7 wherein the extensions of the anode and the cathode are placed at the same position along the width of the axis of the device to provide for a minimum spacing for the first LAC.

9. The ESD device of claim 1 further comprising at least one contact placed on at least the extension.

10. The ESD device of claim 1 wherein the ESD device further comprises an SCR.

11. The ESD device of claim 1 wherein the ESD device is a diode and wherein the first and second lightly doped regions are of the same conductivity type.

12. The ESD device of claim 11 wherein the diode comprises at least one of a pn junction diode, a shallow trench isolation (STI) diode, a non-STI diode, and a gated diode.

13. The ESD protection device of claim 1 wherein the extension is partly formed in a portion of one of the first lightly doped region and the second lightly doped region.

14. The ESD device of claim 13 further comprising a first highly doped region formed within the first lightly doped region and a second highly doped region formed within the second lightly doped region.

15. The ESD device of claim 14 wherein said region the extension comprises one of the first highly doped region and the second highly doped region.

16. The ESD device of claim 14 wherein the length of the first highly doped region is greater than the length of the anode.

17. The ESD device of claim 14 wherein the length of the second highly doped region is greater than the length of the cathode.

18. The ESD device of claim 14 wherein the length of the first highly doped region is greater than the length of the anode and the length of the second highly doped region is greater than the length of the cathode.

19. An electrostatic discharge (ESD) protection device comprising:
an anode formed within a first lightly doped region and a cathode formed within a second lightly doped region; and
a gate region comprising oxide formed over only a portion of the width axis of the anode or cathode to provide localized current to trigger the device.

20. The ESD device of claim 19 wherein the gate oxide region comprises polycrystalline silicon (polysilicon) over an active area, and wherein the active area comprises an area of a highly doped region excluding isolation.

21. The ESD device of claim 19 wherein the gate oxide region comprises a polycrystalline silicon (polysilicon) over isolation.

22. The ESD device of claim 19 further comprising a first highly doped region formed within the first lightly doped region and a second highly doped region formed within the second lightly doped region.

23. The ESD device of claim 19 wherein the gate oxide region extends beyond the anode.

24. The ESD device of claim 19 wherein the gate oxide region extends beyond the cathode.

25. The ESD device of claim 19 wherein the ESD device further comprises an SCR.

26. The ESD device of claim 19 wherein the ESD device is a diode and wherein the first and second lightly doped regions are of the same conductivity type.

27. The ESD device of claim 26 wherein the diode comprises at least one of a pn junction diode, a standard trench isolation (STI) diode, a non-STI diode, and a gated diode.

28. The ESD protection device of claim 19 wherein the gate oxide region is partly formed over a portion of one of the first lightly doped region and the second lightly doped region.

29. An electrostatic discharge (ESD) protection device comprising:
an anode formed within a first lightly doped region and a cathode formed within a second lightly doped region; and
a third region formed over only a portion of the width axis of the anode or cathode to provide localized current to trigger the device, wherein the third region excludes any type of isolation.

30. The ESD protection device of claim 29 wherein the third region is partly formed over a portion of one of the first lightly doped region and the second lightly doped region.

* * * * *